United States Patent
Wu et al.

(10) Patent No.: US 10,095,424 B2
(45) Date of Patent: *Oct. 9, 2018

(54) APPARATUS AND METHOD FOR PROGRAMMING NON-VOLATILE MEMORY USING A MULTI-CELL STORAGE CELL GROUP

(71) Applicant: INTEL CORPORATION, Santa Clara, CA (US)

(72) Inventors: Wei Wu, Portland, OR (US); Yi Zou, Portland, OR (US); Jawad B. Khan, Cornelius, OR (US); Xin Guo, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 127 days.

This patent is subject to a terminal disclaimer.

(21) Appl. No.: 15/228,729

(22) Filed: Aug. 4, 2016

(65) Prior Publication Data

US 2018/0039429 A1    Feb. 8, 2018

(51) Int. Cl.
*G06F 12/00*    (2006.01)
*G06F 3/06*    (2006.01)
(Continued)

(52) U.S. Cl.
CPC .......... *G06F 3/0616* (2013.01); *G06F 3/0644* (2013.01); *G06F 3/0688* (2013.01);
(Continued)

(58) Field of Classification Search
None
See application file for complete search history.

(56) References Cited

U.S. PATENT DOCUMENTS 5,754,469 A    5/1998    Hung et al.
8,248,124 B2    8/2012    Mosalikanti et al.
(Continued)

FOREIGN PATENT DOCUMENTS

KR    20110099563    9/2011

OTHER PUBLICATIONS

International Search Report and Written Opinion for International Application No. PCT/US2017/041606, dated Oct. 19, 2017, 13 pp.
(Continued)

*Primary Examiner* — John A Lane
(74) *Attorney, Agent, or Firm* — Konrad Raynes Davda & Victor LLP; David W. Victor

(57) ABSTRACT

Provided are an apparatus, method, and system for programming a multi-cell storage cell group. A non-volatile memory has storage cells. Each storage cell is programmed with information using a plurality of threshold voltage levels and each storage cell is programmed from bits from a plurality of pages. A memory controller is configured to program the storage cells and to organize the storage cells in the non-volatile memory into storage cell groups. Each storage cell group stores a number of bits of information and each of the storage cells in each of the storage cell groups is programmed with the plurality of threshold voltage levels. The memory controller selects bits from the pages to write for one storage cell group and determines at least one threshold voltage level to use for each of the storage cells in the storage cell group to program the selected bits in the storage cell group.

25 Claims, 14 Drawing Sheets

(51) Int. Cl.
    *G11C 11/56* (2006.01)
    *G06F 12/1009* (2016.01)
(52) U.S. Cl.
    CPC ...... *G06F 12/1009* (2013.01); *G11C 11/5628* (2013.01); *G11C 11/5635* (2013.01); *G11C 11/5642* (2013.01); *G06F 2212/1036* (2013.01); *G06F 2212/2022* (2013.01); *G06F 2212/7201* (2013.01)

(56) References Cited

U.S. PATENT DOCUMENTS

| | | | |
|---|---|---|---|
| 8,482,977 | B2 | 7/2013 | Kim et al. |
| 8,533,550 | B2 | 9/2013 | Khan |
| 8,751,904 | B2 | 6/2014 | Wang et al. |
| 9,251,060 | B2 | 2/2016 | Khan et al. |
| 2004/0037144 | A1 | 2/2004 | Pascucci et al. |
| 2007/0035994 | A1 | 2/2007 | Kong et al. |
| 2009/0073762 | A1 | 3/2009 | Lee et al. |
| 2009/0290414 | A1* | 11/2009 | Hosono ............... G11C 11/5628 365/185.03 |
| 2009/0327841 | A1 | 12/2009 | Litsyn et al. |
| 2011/0055461 | A1 | 3/2011 | Steiner et al. |
| 2011/0075478 | A1* | 3/2011 | Yoon .................. G06F 11/1072 365/185.03 |
| 2013/0170296 | A1 | 7/2013 | Yun |
| 2013/0242653 | A1 | 9/2013 | Kim |
| 2013/0294157 | A1 | 11/2013 | Sharon et al. |
| 2013/0294159 | A1 | 11/2013 | Bauer |
| 2014/0056069 | A1 | 2/2014 | Park et al. |
| 2014/0071761 | A1 | 3/2014 | Sharon et al. |
| 2016/0371028 | A1* | 12/2016 | Berman .................. G06F 12/00 |

OTHER PUBLICATIONS

International Search Report and Written Opinion for International Application No. PCT/US2017/048514, dated Dec. 11, 2017, 12 pp.

Notice of Allowance for U.S. Appl. No. 15/228,699, dated Aug. 4, 2016, 13 pp.

U.S. Pat. No. 8,482,977, dated Jul. 9, 2013, is an English language equivalent of KR Publication No. 2011-0099563, dated Sep. 8, 2011.

Cai, Y., et al., "Threshold Voltage Distribution in MLC NAND Flash Memory: Characterization, Analysis, and Modeling", Proceedings of the Conference on Design, Automation and Test in Europe 13, 2013, 6 pp.

Li, J., et al., "How Much Can Data Compressibility Help to Improve NAND Flash Memory Lifetime?", Proceedings of the 13th USENIX Conference on File and Storage Technologies, Feb. 2015, 15 pp.

Yaakobi, E., et al., "Error-Correcting Codes for TLC Flash", Flash Memory Summit, Aug. 2011, 24 pp.

U.S. Appl. No. 15/228,699, entitled "Apparatus and Method for Endurance Friendly Programming Using Lower Voltage Thresholds", Invented by W. Wu et al., filed Aug. 4, 2016, 60 pp.

U.S. Appl. No. 15/276,588, entitled "Method and Appratus for Programming Non-Volatile Memory Using a Multi-Cell Storage Cell Group to Provide Error Location Information for Retention Errors", filed Sep. 26, 2016, invented by W. Wu et al., 56 pp.

Office Action 1 for U.S. Appl. No. 15/276,588, dated Jan. 26, 2017, 11 pp.

Response to Office Action 1 for U.S. Appl. No. 15/276,588, dated Apr. 26, 2017, 13 pp.

International Search Report and Written Opinion for International Application No. PCT/US2017/041603, dated Oct. 18, 2017, 12 pp.

Response to Office Action 1 for U.S. Appl. No. 15/228,699, dated Sep. 12, 2017, 15 pp.

Amendment 2 for U.S. Appl. No. 15/276,588, dated Aug. 4, 2017, 10 pp.

Office Action 2 for U.S. Appl. No. 15/276,588, dated Sep. 26, 2017, 12 pp.

Office Action 1 for U.S. Appl. No. 15/228,699, dated Jun. 12, 2017, 22 pp.

Notice of Allowance 1 for U.S. Appl. No. 15/276,588, dated May 15, 2017, 9 pp.

\* cited by examiner

Device Page Information

State Mapping

| states/cell | Total states by 4 cells | Nr of bits | By individual cells |
|---|---|---|---|
| 8 | 4096 | 12 | 3*4 = 12 |
| 7 | 2401 | 11 | 2*4 = 8 |
| 6 | 1296 | 10 | |
| 5 | 625 | 9 | |
| 4 | 256 | 8 | |
| 3 | 81 | 6 | 1*4 = 4 |
| 2 | 16 | 4 | |

FIG. 5

| Cell$_i$ | Cell$_j$ | ($B_3B_2$, $B_1B_0$) | MSB - MSB$_0$ | LSB - L$_1$L$_0$ |
|---|---|---|---|---|
| E | E | 11, 11 | 1 | 11 |
|   | P1 | 11, 10 | 1 | 10 |
|   | P2 | 11, 00 | 1 | 00 |
| P1 | E | 10, 11 | 1 | 01 |
|   | P1 | 10, 10 | 0 | 11 |
|   | P2 | 10, 00 | 0 | 00 |
| P2 | E | 00, 11 | 0 | 01 |
|   | P1 | 00, 10 | 0 | 10 |
|   | P2 | 00, 00 | 0 | 01 |

LSB First:

FIG. 9A

| Cell$_i$ \ Cell$_j$ | E | P1 | P2 |
|---|---|---|---|
| E | _,11 | _,10 | _,00 |
| P1 | _,01 | | |
| P2 | | | |

(a) Programming LSB

FIG. 9B

| Cell$_i$ \ Cell$_j$ | E | P1 | P2 |
|---|---|---|---|
| E | 1,11 | 1,10 | 1,00 |
| P1 | 1,01 | | |
| P2 | | | |

(b) Programming MSB = '1'

FIG. 9C

| Cell$_i$ \ Cell$_j$ | E | P1 | P2 |
|---|---|---|---|
| E | _,11 | _,10 | _,00 |
| P1 | _,01 | 0,11 | 0,00 |
| P2 | 0,01 | 0,10 | |

(c) Programming MSB = '0'

LSB First Table

| 3 Input Bits | First Programming Cycle (Cell$_i$,Cell$_j$) | Second Programming Cycle (Cell$_i$,Cell$_j$) |
|---|---|---|
| 111 | No Programming, No Programming | No Programming, No Programming |
| 110 | No Programming, P1 | No Programming, No Programming |
| 100 | No Programming, P2 | No Programming, No Programming |
| 101 | P1, No Programming | No Programming, No Programming |
| 011 | No Programming, No Programming | P1, P1 |
| 000 | No Programming, P2 | P1, No Programming |
| 001 | P1, No Programming | P2, No Programming |
| 010 | No Programming, P1 | P2, No Programming |
|  |  |  |

| Cell_i \ Cell_j | E | P1 | P2 |
|---|---|---|---|
| E | 1,_ | | |
| P1 | | 0,_ | |
| P2 | | | |

(a) Programming MSB

FIG. 11B

| Cell_i \ Cell_j | E | P1 | P2 |
|---|---|---|---|
| E | 1,11 | 1,10 | 1,00 |
| P1 | 1,01 | | |
| P2 | | | |

(b) Programming LSB, w/ MSB = '1'

FIG. 11C

| Cell_i \ Cell_j | E | P1 | P2 |
|---|---|---|---|
| E | | | |
| P1 | | 0,11 | 0,00 |
| P2 | 0,01 | 0,10 | 0,01 |

(c) Programming LSB, w/ MSB = '0'

MSB First Table

| 3 Input Bits | First Programming Cycle (Cell$_i$,Cell$_j$) | Second Programming Cycle (Cell$_i$,Cell$_j$) |
|---|---|---|
| 111 | No Programming, No Programming | No Programming, No Programming |
| 110 | No Programming, No Programming | No Programming, P1 |
| 100 | No Programming, No Programming | No Programming, P2 |
| 101 | No Programming, No Programming | P1, No Programming |
| 011 | P1, P1 | No Programming, No Programming |
| 000 | P1, P1 | No Programming, P2 |
| 001 | P1, P1 | P2, P2 |
| 010 | P1, P1 | P2, No Programming |
|  |  |  |

APPARATUS AND METHOD FOR PROGRAMMING NON-VOLATILE MEMORY USING A MULTI-CELL STORAGE CELL GROUP

TECHNICAL FIELD

Embodiments described herein generally relate to a method and apparatus for programming non-volatile memory using a multi-cell storage cell group.

BACKGROUND

Solid state storage devices (for example, solid state drives) may be comprised of one or more packages of non-volatile memory dies, where each die is comprised of storage cells, where storage cells are organized into pages and pages are organized into blocks. Each storage cell can store one or more bits of information. A multi-level cell (NAND) representing two bits of information is programmed with four threshold voltage levels, E, P1, P2, and P3. The NAND flash memory lifetime is limited to a predetermined number of program/erase (P/E) cycles, and after that limit data retention becomes unreliable. A common metric to express lifetime is Total Bytes Written (TBW).

There is a need in the art for improved techniques for storing in storage cells of a non-volatile memory storage device.

BRIEF DESCRIPTION OF THE DRAWINGS

Embodiments are described by way of example, with reference to the accompanying drawings, which are not drawn to scale, in which like reference numerals refer to similar elements.

FIG. 5 provides a table showing a number of states and bits for different numbers of voltage thresholds used.

FIGS. 9A, 9B, 9C illustrate a two-step programming of the least significant bits and then the most significant bit to a storage cell pair.

FIG. 10 illustrates a programming table of the programming steps to program a storage cell pair according to FIGS. 9a, 9b, 9c.

FIGS. 11A, 11B, 11C illustrate a two-step programming of the most significant bit and then the least significant bits to a storage cell pair.

FIG. 12 illustrates a programming table of the programming steps to program a storage cell pair according to FIGS. 11A, 11B, 11C.

DESCRIPTION OF EMBODIMENTS

Figure 1:
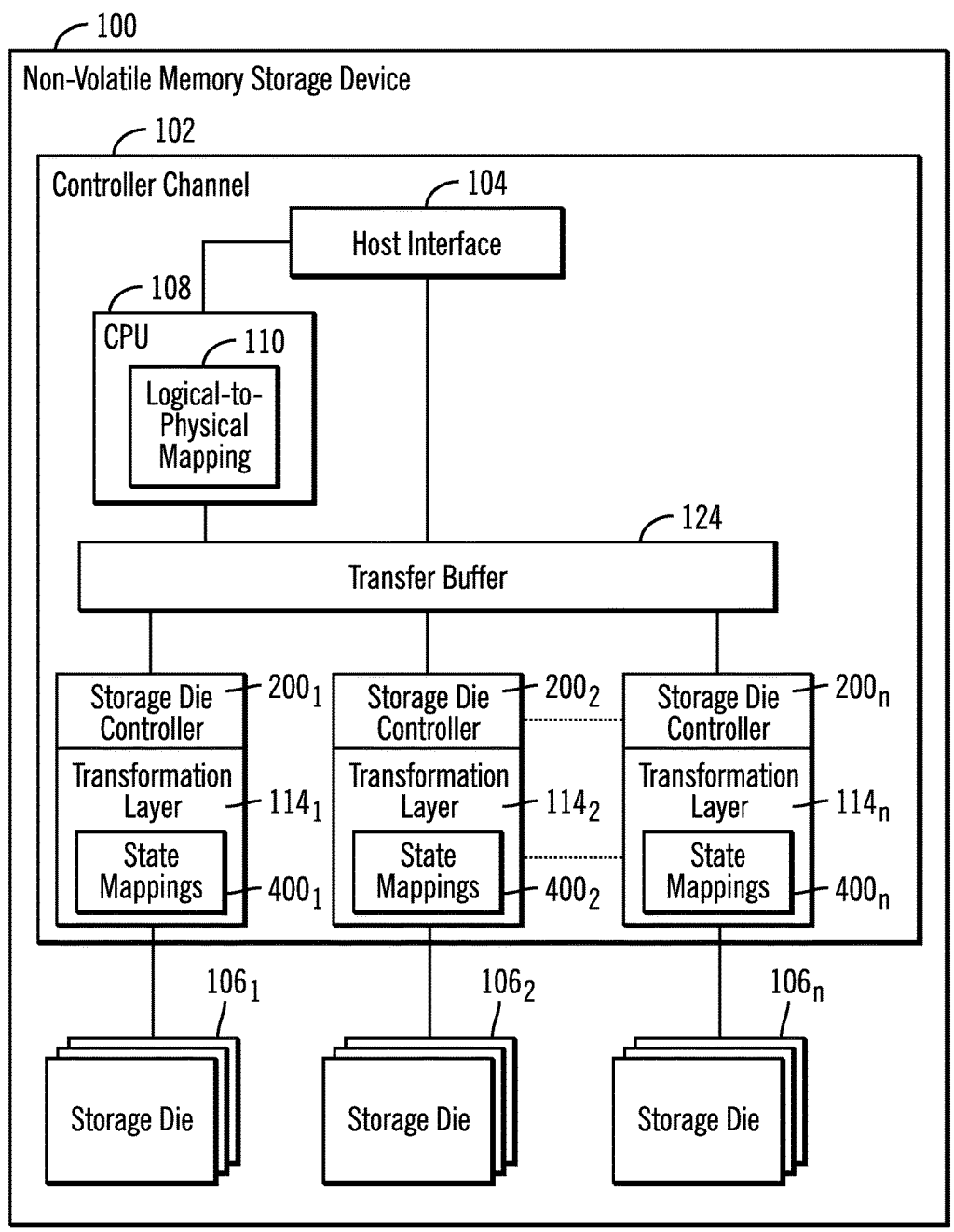
FIG. 1 illustrates an embodiment of a non-volatile memory storage device.

Described embodiments provide techniques to group storage cells in a storage cell group of multiple storage cells to allow for use of less voltage thresholds than available to represents the states for a received number of bits in a non-volatile memory storage device, such as a NAND flash memory. By grouping storage cells into storage cell groups to store bits from received pages, a fewer number of threshold voltage levels may be used to represent the received bits because more storage cells, as grouped in a storage cell group, are being used to store the received bits.

The developer of the memory storage device may be interested in programming the memory storage device to use fewer than all available threshold voltage levels in situations where the developer is not assured that the memory storage device operates at all available $2^n$ threshold voltage levels with sufficient success. In such case, the NAND storage device may be programmed to use a fewer number of threshold voltage levels and a fewer number of programmable states than available that are known to work with a sufficient degree of success. Restricting the device to a predictably operable fewer number of threshold voltage levels allows introduction of the greater capacity NAND device with a fewer number of states and threshold voltages than available in the device. Moreover, the developer may be interested to use a device which has more than $2^n$ voltage levels, but less than $2^{n+1}$ voltage levels. So, as an individual cell, it may only use the $2^n$ levels that represent n-bits, and the rest of the voltage levels are wasted. Still further, the NAND storage device can be presented as capable of operating with a capacity at or greater than the bits per storage cell being provided by grouping multiple storage cells into a storage cell group to store received data.

Further, using the lower of the available threshold voltage levels increases the lifetime of the storage cells because the lower threshold voltage levels, e.g., E, P1, and P2 threshold voltage levels of the available E, P1, P2, and P3 threshold voltage levels of a multi-level cell (MLC) NAND, results in less wear on the storage cells. The higher threshold voltage level P3 provides greater wear of the storage cells, thus reducing their life at a greater rate than the lower threshold voltage levels. In this way, described embodiments modify the manner in which data is written using a fewer number of threshold voltages and states available for different operational purposes.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

FIG. 1 illustrates an embodiment of a non-volatile memory storage device 100 having a controller channel 102, a host interface 104 to transfer blocks of data between a connected host system, and a plurality of groups of storage dies $106_1, 106_2 \ldots 106_n$ implementing storage cells that may be organized into pages of storage cells, where the pages are organized into blocks. The non-volatile memory storage device 100 may function as both a memory device and/or a storage device in a computing system, and may be used to perform the role of volatile memory devices and disk drives in a computing system. In an embodiment, the non-volatile memory storage device 100 may comprise a solid state drive (SSD) of NAND storage dies $106_1, 106_2 \ldots 106_n$. The controller channel 102 includes a central processing unit (CPU) 108 implementing certain control functions, such as a logical-to-physical mapping 110 provides a mapping of logical addresses to which I/O requests are directed and physical addresses in the storage dies $106_1, 106_2 \ldots 106_n$.

The controller channel 102 includes a plurality of storage die controllers $200_1, 200_2 \ldots 200_n$ that manage read and write requests to blocks of data in pages of storage cells to groups of the storage dies $106_1, 106_2 \ldots 106_n$. A transformation layer $114_1, 114_2 \ldots 114_n$ for each of the storage die controllers $200_1, 200_2 \ldots 200_n$ transforms a received number of bits (e.g., k bits) in pages of data from the host to write to storage cell groups of multiple storage cells (each storing m bits, where m is >=k) in the storage dies $106_1, 106_2 \ldots 106_n$ and to transform a read m number of bits in a block to the fewer number of k bits of the block of data to return in pages to the host. A host operating system may code pages of data for the memory controller, where multiple of the pages provide the data for each of the multi-level storage cells, such as if each storage cell stores n bits, the host operating system would provide n pages to provide each of the n bits to code in a storage cell.

The transformation layer $114_1, 114_2 \ldots 114_n$ uses the state mappings $300_1, 300_2 \ldots 300_n$ to determine the translation functions to use to transform the fewer k bits to m bits and vice versa. In certain embodiments, the mapping operations for k bits in the received pages to the m bits stored in a storage cell group, and vice versa, are performed by the transformation layer $114_i$. In alternative embodiments, the mapping operations may be performed by the I/O logic 202, where the transformation layer $114_i$ is implemented in the I/O logic 202.

For instance, if each multi-level cell comprises n bits, then storage device 100 would provide $2^n$ different threshold voltage levels to program the $2^n$ different states for a storage cell. If storage cells are grouped into groups of p storage cells each, then each storage cell group has $2^{np}$ states of information, and allow storage of m bits of information for a block of data, where $m=\text{Log}_2(2^{np})$ bits of information. The controller 102 and transformation layers $114_1, 114_2 \ldots 114_n$ may be programmed to only use j threshold voltage levels, less than the $2^n$ available threshold voltage levels. A storage cell group of p storage cells programmed to only use j threshold voltage levels would be capable of representing $j^p$ states with k bits of information, where k<m and k is a largest integer less than or equal to $\text{Log}_2(j^p)$.

The storage dies $106_1, 106_2 \ldots 106_n$ may comprise electrically erasable and non-volatile memory cells. For instance, the storage dies $106_1, 106_2 \ldots 106_n$ may comprise NAND dies of memory cells, also known as NAND chips or packages. In one embodiment, the NAND dies may comprise multilevel cell (MLC) NAND flash memories where each cell records two bit values, a lower bit value and an upper bit value. Alternatively, the NAND dies may comprise single level cell (SLC), multi-level cell (MLC), triple level cell (TLC) NAND memories, etc. The NAND dies, TLC, MLC, SLC, etc., may be organized in a three dimensional (3D) or two dimensional (2D) physical structure. The storage dies $106_1, 106_2 \ldots 106_n$ may further comprise ferroelectric random-access memory (FeTRAM), nanowire-based non-volatile memory, three-dimensional (3D) crosspoint memory such as phase change memory (PCM), memory that incorporates memristor technology, Magnetoresistive random-access memory (MRAM), Spin Transfer Torque (STT)-MRAM, a single level cell (SLC) Flash memory and other electrically erasable programmable read only memory (EEPROM) type devices.

The host interface 104 connects the memory device 100 to a host system (not shown). The memory device 100 may be installed or embedded within a host system, such as shown and described with respect to FIG. 14, or the memory device 100 may be external to the host system. The host interface 104 may comprise a bus interface, such as a Peripheral Component Interconnect Express (PCIe) interface, Serial AT Attachment (SATA), Non-Volatile Memory Express (NVMe), etc.

The processing components in the non-volatile memory storage device 100, including the storage die controller $200_1, 200_2 \ldots 200_n$ and transformation layers $114_1, 114_2 \ldots 114_n$ may be implemented as firmware or in one or more application specific integrated circuits (ASIC) within the non-volatile memory storage device 10. Alternatively, these components may be implemented in a software program executed by a processor of the non-volatile memory storage device 100.

In certain embodiments, the storage dies $106_1, 106_2 \ldots 106_n$ may comprise n-bit multi-level cells, where each cell can be programmed into $2^n$ states represented by $2^n$ different threshold voltage levels. For a multi-level cell (MLC) NAND flash memory storing 2 bits per cell, there may be four voltage thresholds, E, P1, P2, and P3 to represent the four states that may be programmed into cells. A tri-level cell (TLC) flash memory cell may be programmed with eight threshold voltage levels. In certain embodiments, the storage die controller $200_i$ may organize storage cells for writing into storage cell groups comprising p storage cells. For example, for an n-bit cell organized into a cell group of p, each cell group can store m bits of information, where $m=\log2(2^{np})$, and each storage cell group may represent $2^{np}$ different states, which can be programmed with $2^{np}$ different voltage level combinations. The pages of cells may be organized into a block of pages, where an erase operation to restore the state of the cells to the E or erase state is performed on a block basis.

The transformation layers $114_1, 114_2 \ldots 114_n$ may receive a block of k bits of information to write, which is less than the m bits of information for a block in a storage cell group. The fewer k bits may result from compression or the host operating system being programmed to provide a block of data comprising k bits. To reduce the wear on the storage cells, described embodiments use a set of the lowest threshold voltage levels that is less than all the available threshold voltage levels, to represent all possible states of the received k bits. Because fewer bits are being written, the states may be expressed with a smaller number of threshold voltage levels. Further, because programming the cells with the higher voltage levels results in greater wear on the cells, programming the fewer k bits with the lower threshold voltage levels of all available threshold voltage levels reduces the wear on the storage cells. For instance, the transformation layer $114_1, 114_2 \ldots 114_n$ may only need to use the lowest j threshold voltages of the available $2^n$ threshold voltages to represent the states of the k bits, where j is the smallest integer $>=2^{k/p}$, where k is the received bit size and p is the number of cells in a storage cell group.

Figure 2:
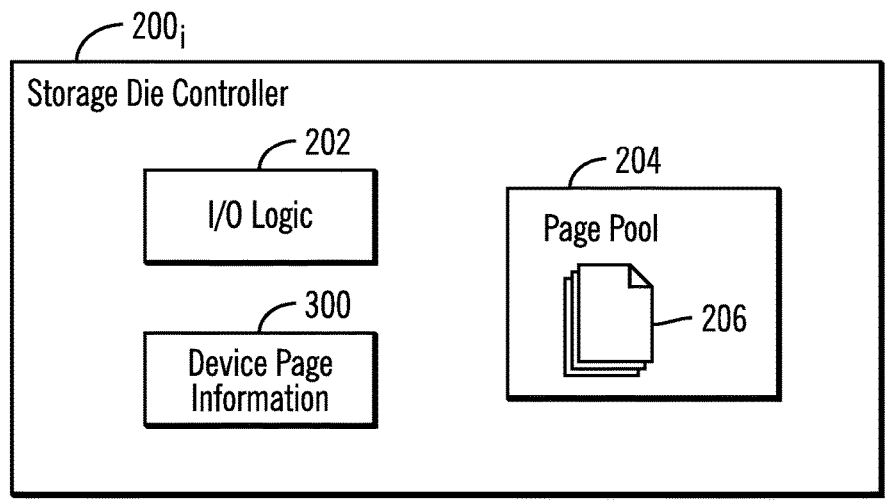
FIG. 2 illustrates an embodiment of a storage die controller.

FIG. 2 shows additional components that may be included in each storage die controller $200_i$ managing writes to a group of storage dies $106_i$, including Input/Output (I/O) logic 202 processes read/write commands from an attached host (not shown) in a command queue (not shown), from which the commands are accessed and executed. The I/O logic 202 maintains a page pool 204 of a plurality of available pages 206 for the storage dies $106_i$ and device page information 300 having information on device pages configured to use pages 206 from the page pool 204. Each device page having n bits per storage cell may be assigned n pages 206 from the page pool 204 to store the blocks of data. An MLC NAND having two bits per storage cell, would have an upper and lower pages, a triple level cell (TLC), would have three bits per storage cell and three pages for the three bits.

Figure 3:
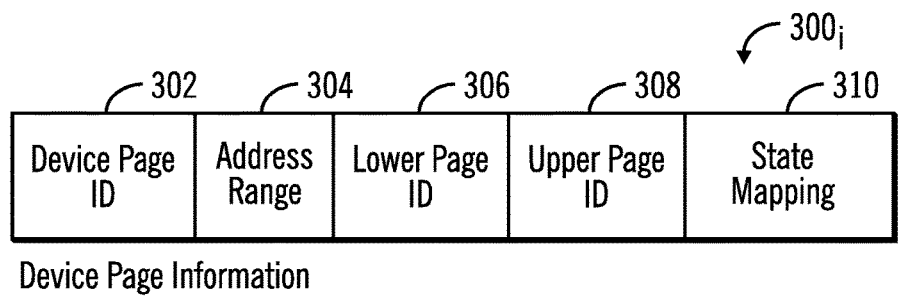
FIG. 3 illustrates an embodiment of device page information for a device page.

FIG. 3 illustrates an instance of device page information $300_i$ for a page of data storing the data for the n-bit storage cells, including a device page identifier 302, an address range 304 of addresses stored in the page $300_i$, a lower page ID 306 identifying one of the pages 206 allocated as a lower page to store one bit of the storage cell; an upper page ID 308 to store one bit of the storage cell, where there may be n pages allocated to a device page for an n-bit storage cell; and a state mapping 310 indicating the state mapping providing the bit translation functions used to map the read data to the storage cell groups implemented in the pages 306, 308.

FIG. 3 illustrates upper and lower pages for an MLC NAND having two bits per storage cell. For a TLC, there would be three pages for the three bits per storage cell, and for a NAND having n bits per storage cell, there may be n pages. The pages map to address ranges in the storage dies $106_1, 106_2 \ldots 106_n$.

Figure 4:
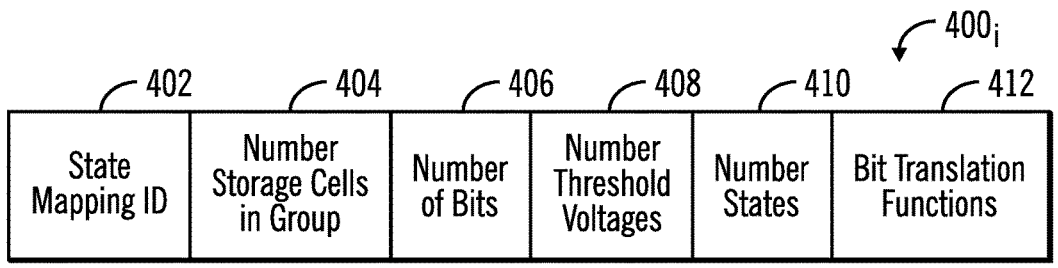
FIG. 4 illustrates an embodiment of a state mapping providing translations functions to transform bits received.

FIG. 4 illustrates an embodiment of a state mapping 400, comprising one of the state mappings $400_1, 400_2 \ldots 400n$, as including a state mapping ID 402 identifying the mapping; a number of storage cells in a storage cell group 404 (p); a number of bits 406 of a received block to write to the storage cells in the storage cell group, or k; a number of threshold voltages 408 used for each cell of a storage cell group, where the number of threshold voltages 408 may comprise a subset of the total threshold voltages available for use, which may comprise a subset of the lowest threshold voltages for a set of threshold voltages; a number of states 410 that may be programmed with the received block of k bits, e.g., $j^p$; and bit translation functions 412, which may include cell mapping, map the k received bits 406, or k, to states coded using the number of threshold voltages 408 per storage cell. If the data is not to be mapped, such as if the read block of data (m bits) is the same as the received block (k bits) write data, then the bit translation functions 412 may indicate no translation is needed. If j threshold voltages are used of the $2^n$ available threshold voltages, where there are $2^n$ states per storage cell, the number of bits being mapped k comprises a largest integer less than or equal to $\mathrm{Log}_2(j^p)$.

For instance for a storage cell group comprising a storage cell pair, i.e., p=2, the number of possible states or bits of information that may be stored in a storage cell pair group is sixteen states or four bits of information that can be programmed with 16 threshold voltage level combinations. However, if the non-volatile memory storage device 100 is programmed to use a fewer number of threshold voltages, such as use three of the four available threshold voltages for an MLC NAND memory, then the highest P3 voltage is not needed and the possible states of the received three bits can be represented with the three lowest threshold voltage levels, such as E, P1, and P2.

FIG. 5 is a table 500 providing information when there are four storage cells of a TLC NAND, or n=3, in a storage cell group, p=4. For TLC NAND, there are 8 threshold voltages or states per storage cell. The table has a first column 502 identifying different number of threshold voltages per cell that may be used, from all eight to fewer number of available threshold voltages. A second column 504 shows the total number of states that may be programmed in the four storage cells in a storage cell group using the number of threshold voltages 502, which is $j^p$, where j is the number of threshold voltages per storage cell being used, indicated in column 502, and p is the number of storage cells per group. A third column 506 provides the number of bits that may be stored in the storage cell group when programmed with the number of threshold voltages per storage cell in the first column 502. A fourth column 508 shows a total number of bits that may be stored in the storage cell group when programmed with each individual cell independently, that is not as a group. For instance, the number of bits to program (k) indicated in the third column 506 may comprise a largest integer less than or equal to $\mathrm{Log}_2(j^p)$. As can be seen from FIG. 5, grouping the storage cells in a group allows a greater number of bits to be programmed into the cells of the storage cell group, and that number decreases as the memory device 100 is programmed to use fewer number of available threshold voltages, such as indicated in the first column 502.

In certain embodiments, the multiple pages provide the bits to code in a storage cell group. In an MLC flash, two pages provide the bits for each storage cell, where one page has the first most significant bits (MSB) and the other page has the least significant bits to another page, referred to as upper and lower pages. For a TLC memory, the three bits for each storage cell are written to three different pages. In MLC flash, data can be erased at a block at a time to set the storage cells to the E threshold voltage level. An entire page (usually 1 kB, 2 KB or 4 kB) is written together.

Figures 6A, 6B:
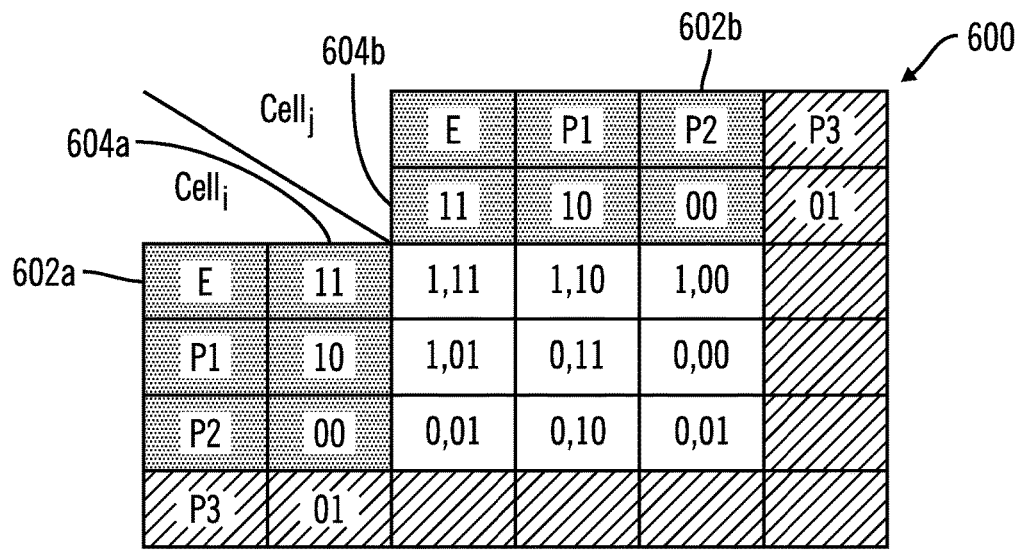
FIG. 6A illustrates an embodiment of a cell-to-bit mapping of threshold voltage levels for a storage cell pair to three bits of information.
FIG. 6B illustrates a truth table to map storage cell threshold voltage levels to four bits read from the storage and to the three bits to return.

FIG. 6A illustrates an embodiment of a cell-to-bit mapping 600 to map k=3 bits of information supplied by multiple of the pages (upper and lower or first and second pages to a storage cell pair, where there are two storage cells in a storage cell group (p=2), and there are two bits stored in a cell, i.e., a MLC storage cell. The mapping 600 may be implemented in the bit translation functions 412 that would determine from the mapping 600 the threshold voltages to use to program the received k bits. The mapping 600 shows that the highest P3 threshold voltages are not used to program the received three bits, and shows that all nine possible states of the three bits may be represented by the three lowest threshold voltages E, P1, and P2 in the storage cells$_{i,j}$, where i and j may be consecutive numbers representing consecutive storage cells. The first column 602a shows the different programming states E, P1, and P2 for cell$_i$ and the first row 602b shows the different programming states E, P1, and P2 for cell$_j$ of the storage cell pair. The second column 604a and second row 604b show the normal 2 bit coding for each storage cell, wherein the first bit is for a lower page and a second bit is for the upper page. The cells of the table show the nine possible states 410 of the received three bits to store, and columns 602a and rows 602b show the threshold voltages to use for the first (cell$_i$) and second (cell$_j$) cells of the pair, respectively.

FIG. 6B shows a truth table 620 based on the mapping 600 that shows the different threshold voltage levels for the first cell in the voltage column 622a and for the second cell in the voltage column 622b, the full four bits in the bit column 624 coded by the threshold voltages 622a, 622b and the MSB and LSBs for the three bit values represented by the threshold voltages in the voltage columns 622a, 622b in the bit columns 626a, 626b, respectively. The truth table 620 only uses the three lowest voltage thresholds E, P1, and P2 of the available threshold voltage levels E, P1, P2, and P3 used when expressing all possible 16 states of the 4 bits that can be stored in the storage cell pair.

From the truth table 620, upon selecting three bits to write from pages in the transfer buffer 124, the MSB and LSBs of the received three bits are coded using the three lowest threshold voltages as shown in the columns 622a, 622b for the received three bits in the columns 626a, 626b. The truth table 620 is used to determine how the read and decoded four bit state from a storage cell pair, represented in the bits in column 624 maps to the received three bits 626a, 626b that were written to the storage cell pair.

The four bits read from the pair of storage cells may be translated to the received three bits based on the truth table 620 as follows, where $M_0$ is the MSB bit, $B_0$, $B_1$, $B_2$, $B_3$ correspond to the four bits read from a storage cell pair, $L_0$ is a first least significant bit of the three bits, $L_1$ is a second least significant bit of the three bits, $B_0'$, $B_3'$, and $B_1'$ represent inverses of the value, "+" is an OR function, and "*" is an AND function:

$$M_0 = B_2 + B_3 * B_0 \quad (1)$$

$$L_0 = B_0 + B_3' * B_1' + B_3 * B_2 * B_1 \quad (2)$$

$$L_1 = B_2 * B_1 + B_1 * B_0 \quad (3)$$

Thus, the bit translation function 412 in a state mapping 400$_i$ where the number of bits 406 in a block is three, the number of storage cells in a storage cell group 404 is two, the number of threshold voltages 408 is three, and the number of states 410 is nine, implement the mappings 600 and truth table 620 of FIGS. 6a and 6b to map the received k bits 406 to the number of m bits stored in the storage cell group and then map the read m bits from a storage cell group to the received k bits to return to a host. For instance, to map the read block of four bits from a storage cell pair of MLC NAND cells (n=2) to the initially received 3 bits, the above three translation functions (1), (2), and (3) can be used to translate the read four bits from the storage cell pair to the received three bits to return to the requesting host.

Figure 7A:
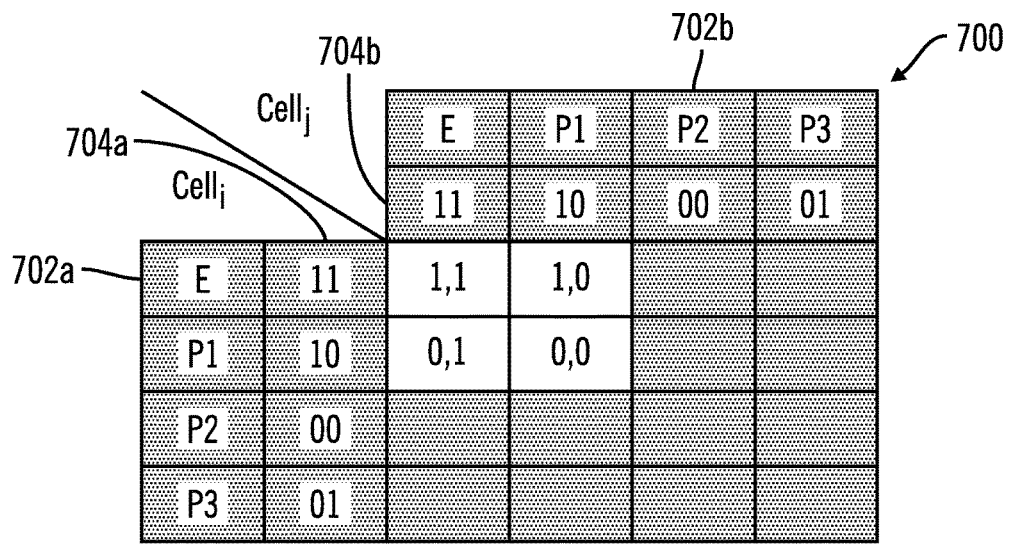
FIG. 7A illustrates an embodiment of a cell-to-bit mapping of threshold voltage levels for a storage cell pair to two bits of information.

FIG. 7A illustrates an embodiment of a cell-to-bit mapping 700 to map k=2 bits of information selected from two pages to a storage cell pair, where there are two storage cells in a storage cell group, and there are two bits stored in a cell (n=2, i.e., a MLC storage cell. The mapping 700 shows that the highest P3 and P2 threshold voltages are not needed to program the received two bits, and shows all four possible states of the two bits represented by the two lowest threshold voltages E and P1 in the storage cell$_{i,j}$. The first column 702a shows the different programming states E and P1 for cell$_i$ and the first row 702b shows the different programming states E and P1 for cell$_j$ of the storage cell pair. The second column 704a and second row 704b show the normal 2 bit coding for each storage cell, wherein the first bit is for a lower page and a second bit is for the upper page. The cells of the table show the four possible states of the received two bits to store, and rows and columns show the threshold voltages to use for the first (cell$_0$) and second (cell$_1$) cells of the pair.

Figure 7B:
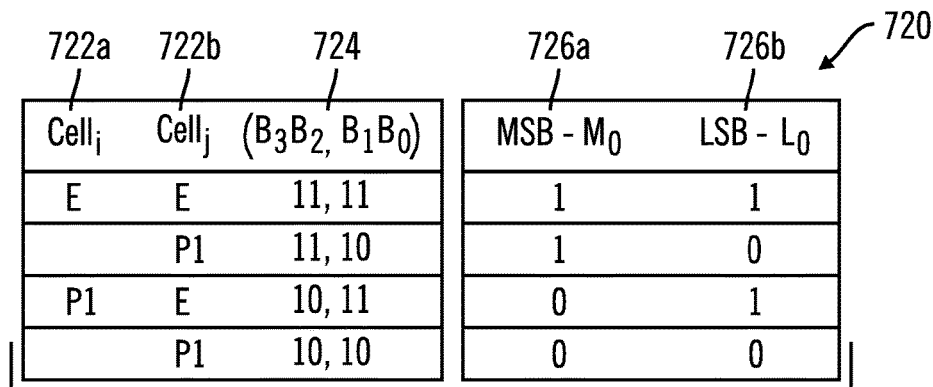
FIG. 7B illustrates a truth table to map storage cell threshold voltage levels to four bits read from the storage and to the two bits to return.

FIG. 7B shows a truth table 720 based on the mapping 700 that shows the different threshold voltages for the first cell in the voltage column 722a and for the second cell in the voltage column 722b, the full four bits in the bit column 624 coded by the threshold voltages 722a, 722b and the MSB and LSB for the two bit values represented by the threshold voltages in the voltage columns 722a, 722b in the bit columns 726a, 726b, respectively. The truth table 720 only uses the two lowest voltage thresholds E and P1 of the available threshold voltage levels E, P1, P2, and P3 used when expressing all possible 16 states of the 4 bits that can be stored in the storage cell pair.

From the truth table 720, upon receiving the two bits to store, the MSB and LSB of the received two bits are coded using the two lowest threshold voltages as shown in the columns 722a, 722b for the received two bits in the columns 726a, 726b. The truth table 720 is used to determine how the read and decoded four bit state from a storage cell pair, represented in the four bits in column 724 maps to the received two bits 726a, 726b that were written to the storage cell pair.

The four bits read for a block from the pair of storage cells may be translated to the received block of two bits based on the truth table 720 as follows, where $M_0$ is the MSB bit, $B_0$, $B_1$, $B_2$, $B_3$ correspond to the four bits read from a storage cell pair, $L_0$ is the least significant bit of the two bits:

$$M_0 = B_2 \quad (4)$$

$$L_0 = B_0 \quad (5)$$

Thus, the bit translation function 412 in a state mapping 400$_i$ where the number of bits 406 is two, the number of storage cells in a storage cell group 404 is two, the number of threshold voltages 408 is two, and the number of states 410 is four, implement the mappings 700 and truth table 720 of FIGS. 7a and 7b to map the received k bits 406 to the number of m bits stored in the storage cell group and then map the read m bits from a storage cell group to the received k bits to return to a host. For instance, to map the read four bits from a storage cell pair of MLC NAND cells (n=2) to the initially received two bits, the above translation functions (4) and (5) can be used to translate the read four bits from the storage cell pair to the received two bits to return to the requesting host.

Figure 8:
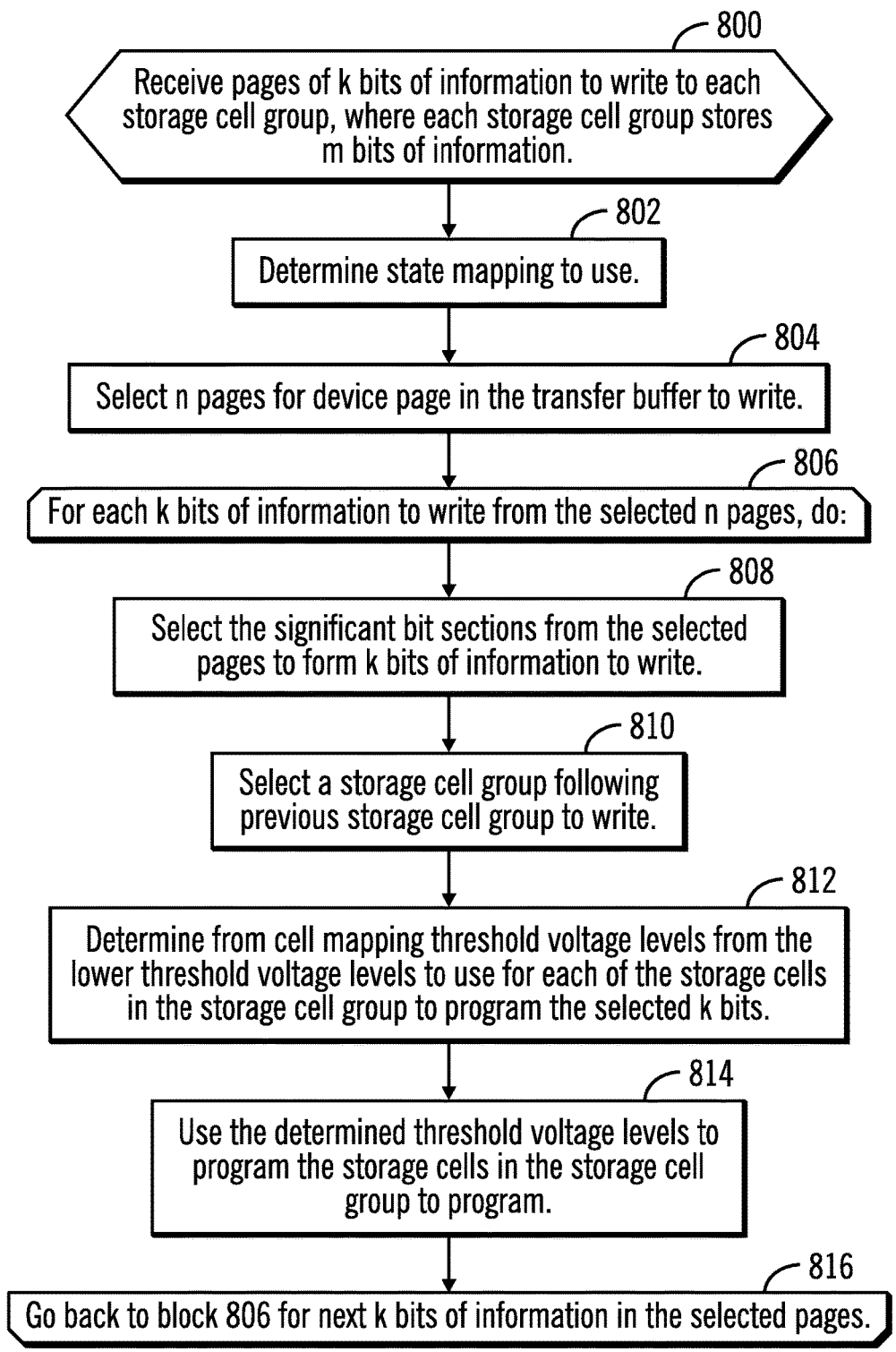
FIG. 8 illustrates an embodiment of operations to write multiple pages of data to device pages organized as a storage cell group(s).

FIG. 8 illustrates an embodiment of operations performed by the I/O logic 202 and transformation layer 114$_i$ to process pages in the transfer buffer 124 providing blocks of k bits of information to write to storage cell groups, where each storage cell group stores m bits of information, where m>k. Upon processing (at block 800) multiple pages in a device page $300_i$ providing the k bits to write to storage ell groups, the I/O logic 202 or transformation layer $114_i$ determines (at block 802) the state mapping $400_i$ to use. The determined state mapping $400_i$ may be based on the mapping $400i$ having a number of bits 406 equal to the number of bits k for each received write in the page. Alternatively, the memory device 100 may be programmed to operate using a programmed state mapping $400_i$. The I/O logic 202 selects (at block 804) n pages in the transfer buffer 124 to write, where the n pages provide the n bits for each multi-level storage cell, e.g., two pages provides two bits for an MLC NAND, three pages provides three bits for a TLC NAND, etc.

For each instance of k bits of information in the selected n pages a loop of operations is performed at blocks 806 through 816. At block 808, the transformation layer 114 selects (at block 808) the significant bit sections, e.g., most significant bits (MSB), least significant bits (LSBs), etc., from the selected pages to form k bits of information to write. A storage cell group is selected (at block 810) comprising a first selected storage cell group or following the previous storage cell group written. The transformation layer $114_i$ determines (at block 812) from the cell mapping, e.g., FIG. 6a, 6b, 7a, 7b, the threshold voltage levels from the lower threshold voltage levels to use for each of the storage cells in the storage cell group to program the selected k bits. The selected threshold voltages may be from a subset of the lowest threshold voltage levels available for the storage cells. The transformation layer $114_i$ uses (at block 814) the determined threshold voltage levels to program the storage cells in the storage cell group to program.

FIGS. 9A, 9B, and 9C provide an embodiment for programming three bits read from two pages to each storage cell group of two storage cells in two programming cycles. The storage cells each store two bits (n=2) and each storage cell group comprises a storage cell pair (p=2). The mappings show how to map the received three bits to the storage cells storing four bits, using the three lowest voltage levels. The arrows in FIG. 9C show the permissible voltage level changes to the state by programming one or both cells to one of the voltages P1, P2 of the available three threshold voltage levels P1, and P2. Avoiding programming the cells to the highest possible voltage level P3 reduces the wear of the storage cells and extends their life.

FIG. 9A shows that no voltage needs to be applied to program the LSBs to the E threshold voltage or "11", during the first programming cycle, which would have been programmed during a block erase. During a first programming cycle, programming the second storage $cell_j$ of the pair to the P1 threshold voltage programs the LSBs to 10, programming the second storage $cell_j$ of the pair to the P2 threshold voltage programs the LSBs to 10, and programming the first storage cell, of the pair to the P1 threshold voltage programs the LSBs to 01.

FIG. 9B shows a second programming step to program the MSB bit to a 1 by not performing any programming of either of the $cells_{i,j}$.

FIG. 9C shows the second programming step to program the MSB bit to a "0" by setting one or both of the $cells_{i,j}$ to one of the threshold voltages P1, P2 from the previous programmed state for the LSBs. FIG. 9C shows that the MSB is programmed to "0" by: (1) programming the first $cell_i$ and the second $cell_j$ of the pair to the P1 threshold voltages when the LSBs equal "11", or cells were not programmed in the first step; (2) programming the first storage $cell_i$ of the pair to the P2 threshold voltage when the LSBs were previously programmed to "10", "01"; (3) programming the first storage $cell_i$ of the pair to the P1 threshold voltage when the LSBs were previously programmed to "01".

FIG. 10 provides a table showing how the pair of storage $cells_{i,j}$ are programmed during the first and second programming cycles for the different possible three bits when the LSBs are programmed first, based on the table mappings shown in FIGS. 9A, 9B, and 9C. The programming of FIG. 10 would be used when writing the LSBs first to one of the storage cell pairs. Different programming steps may be provided than those shown in FIG. 10 to program the LSB first.

FIGS. 11A, 11B, and 11C provide an embodiment for programming the received block (e.g., read and write unit) of three bits in the storage cell group when the MSB bit is programmed first to the storage cell pair, where the storage cells each store two bits (n=2) and each storage cell group comprises a storage cell pair (p=2). The arrows in FIGS. 11B and 11C show the permissible voltage level changes to the states in FIG. 11A by programming one or both cells to one of the voltages P1, P2 of the available four threshold voltage levels P1, P2, and P3. Avoiding programming the cells to the highest possible voltage level P3 reduces the wear of the storage cells and extends their life.

FIG. 11A shows that no voltage needs to be applied to program the MSB to the E threshold voltage or "1", which would have been programmed before during a block erase. During a first programming step, programming the first storage $cell_i$ and the second storage $cell_j$ of the pair to the P1 threshold voltage programs the MSB to "0".

FIG. 11B shows a second programming step to program the LSB bits with an MSB bit of 1 by setting the $cells_{i,j}$ to one of the three lowest threshold voltages E, P1, P2 of the available four threshold voltage levels E, P1, P2, and P3. No voltage needs to be applied to program the LSBs to the E threshold voltage to program a "11" when the MSBs is "1". FIG. 11B shows that the LSBs are programmed when the MSB is first programmed to "1" by: (1) programming the first $cell_0$ of the pair to the P1 threshold voltages to program the LSBs to "01"; (2) programming the second storage $cell_j$ of the pair to the P1 threshold voltage to program the LSBs to "10"; and (3) programming the second $cell_j$ to the P2 threshold voltage to program the LSBs to "00".

FIG. 11C shows the second programming step to program the LSBs when the MSB was set to a "0" by setting the $cells_i$, $_j$ to one of the threshold voltages P1, P2 from the previous programmed state for the LSBs. FIG. 11B shows that the LSBs are programmed when the MSB is first programmed to "0" by: (1) programming the first $cell_i$ and the second $cell_j$ of the pair to the P2 threshold voltages to program the LSBs to "01"; (2) programming the second storage $cell_1$ of the pair to the P2 threshold voltage to program the LSBs to "00"; (3) programming the first storage $cell_i$ of the pair to the P2 threshold voltage to program the LSBs to "10"; (4) programming both the first storage $cell_i$ and second storage $cell_j$ to the P2 threshold voltage to program the LSBs to "01".

FIG. 12 provides a table showing how the pair of storage $cells_{i,j}$ are programmed during the first and second programming cycles for the different possible three input bits when the MSB is programmed first, based on the table mappings shown in FIGS. 11a, 11b, and 11c. The programming of FIG. 12 would be used when performing the writing of the MSBs and LSBs in FIGS. 11A and 11B, where the MSB is programmed first.

Figure 13A:
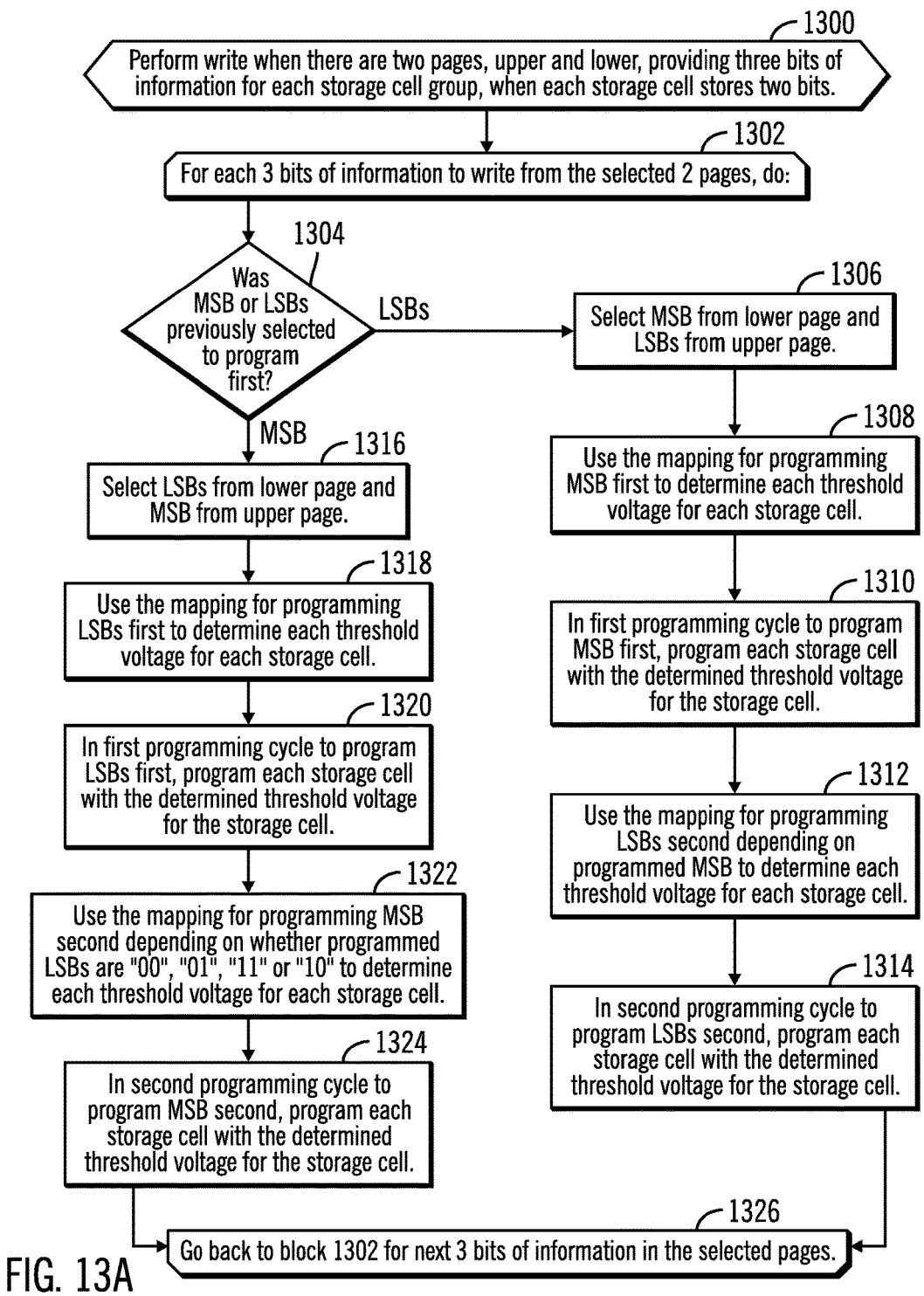
FIGS. 13A, 13B, and 13C provide operations for translating between the bits to write and the information on the bits stored.
Figure 13B:
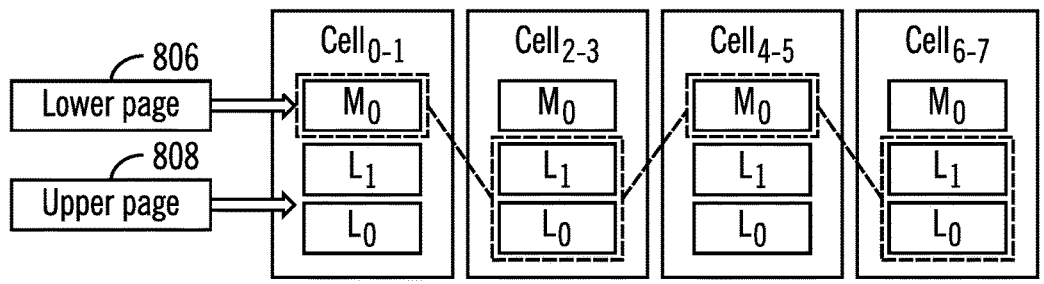
Figure 13C:
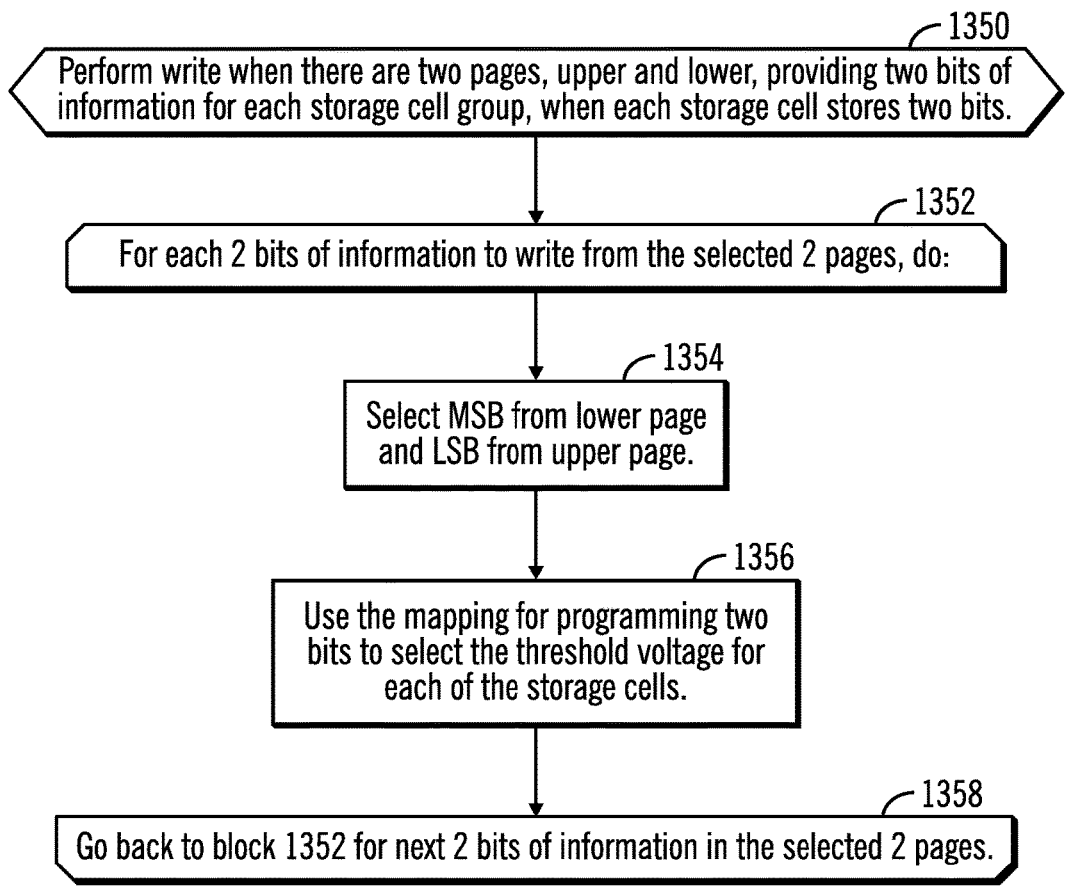

FIGS. 13A, 13B, and 13C illustrate different embodiments for performing the operations at blocks 806 and 808 using the mappings shown in FIGS. 9A, 9B, 9C, 10, 11A, 11B, 11C, 12 in embodiments where each storage cell comprises a storage cell pair of two storage cells (p=2) and each storage cell has 2 bits (n=2), and each device page $300_i$ is allocated two pages, a lower 306 and upper 308, such as the case for an MLC NAND.

FIG. 13A illustrates an embodiment of operations to program the storage cell pairs when the number of received bits 406 for each block to write from the selected two pages, upper and lower, is three and each storage cell group is a pair of two storage cells (n=2). Upon initiating the write (at block 1300) for selected upper and lower pages, the transformation layer $114_i$ performs a loop of operations at blocks 1302 through 1326 for each 3 bits of information to write from the two pages. At block 1304, a determination is made as to whether the one MSB or the LSBs were selected to program first for the last storage cell pair written. If (at block 1304) the LSBs were programmed first for a previous storage cell pair or if the current storage cell to program is the first to program, the transformation layer $114_i$ selects (at block 1306) the MSB from the selected lower page and the two LSBs from the upper page. The mapping for the programming the MSB first (FIG. 11A, 12) is used (at block 1308) to determine each threshold voltage for each storage cell of the storage cell pair being programming. In a first programming cycle to program the MSB first, each storage cell of the pair is programmed (at block 1310) with the determined threshold voltage for the storage cell. The transformation layer $114_i$ uses (at block 1312) the mapping for programming LSBs second (as in FIGS. 11B, 11C, 12) depending on whether the MSB was programmed to a 1 (FIG. 11B) or 0 (FIG. 11C) to determine each threshold voltage for each storage cell. In a second programming cycle to program the two LSBs second, the transformation layer $114_i$ programs (at block 1314) each storage cell with the determined threshold voltage for the storage cell.

If (at block 1304) the one MSB was programmed first for a previous storage cell pair or if the current storage cell to program is the first to program, the transformation layer $114_i$ selects (at block 1316) the MSB from the selected upper page and the two LSBs from the lower page. The mapping for the programming the LSBs first (FIG. 9A) is used (at block 1318) to determine each threshold voltage for each storage cell of the storage cell pair being programming. In a first programming cycle to program the LSBs first, each storage cell of the pair is programmed (at block 1320) with the determined threshold voltage for the storage cell. The transformation layer $114_i$ uses (at block 1322) the mapping for programming MSB second (as in FIGS. 9A, 9B, 9C, 10) depending on whether programmed LSB s are "00", "01", "11", or "10" to determine each threshold voltage for each storage cell. In a second programming cycle to program the one MSB second, the transformation layer $114_i$ programs (at block 1324) each storage cell with the determined threshold voltage for the storage cell.

FIG. 13B illustrates the operations of FIG. 13A in that the MSB and LSBs are alternately selected from the lower and upper pages between storage cell groups to alternate selecting the first MSB bit and two LSB bits between the lower 306 and upper 308 page. For instance as shown in FIG. 13B, for the first pair storage cells$_{0,\ 1}$, the MSB ($M_0$) is selected from the lower page 306 and LSBs upper page 308 and then in cells$_{2,\ 3}$ the MSB is alternately selected from the upper page 308 and the LSBs from the lower page 306.

FIG. 13C illustrates an embodiment of operations to perform the programming cycles when the two pages provide blocks of two bits to write and each storage cell group is a pair of two storage cells and where each of the selected pages 306 or 308 provides one bit for every other storage cell. Upon initiating (at block 1350) the writing, the transformation layer $114_i$ performs a loop of operations at blocks 1352 through 1358 to transform the received 2 bits per storage cell pair. The MSB and LSBs are selected (at block 1354) from the lower and upper pages, respectively. The mapping (FIGS. 7A, 7B) for programming two bits, one from each of the pages, is used (at block 1356) to select the threshold voltage levels from each of the storage cells, where only the two lowest threshold voltage levels need to be used to program all possible states of the storage cell pair having just two bits.

Although FIGS. 13A, 13B, 13C are described with respect to an embodiment of storage cells storing two bits (n=2) and each storage cell group comprising a storage cell pair (p=2), the writing of the fewer number of received k bits to a group of storage cell storing m bits can be extended to other size storage cell groups and storage cells storing more than two bits by alternating the pages to which the fewer number of the MSB bits are written. Alternating the pages to which the smaller number of the MSB bits of the k bits are written distributes the smaller number of MSB bits and larger number of LSBs among the pages to provide wear leveling of the writing to the pages.

Figure 14:
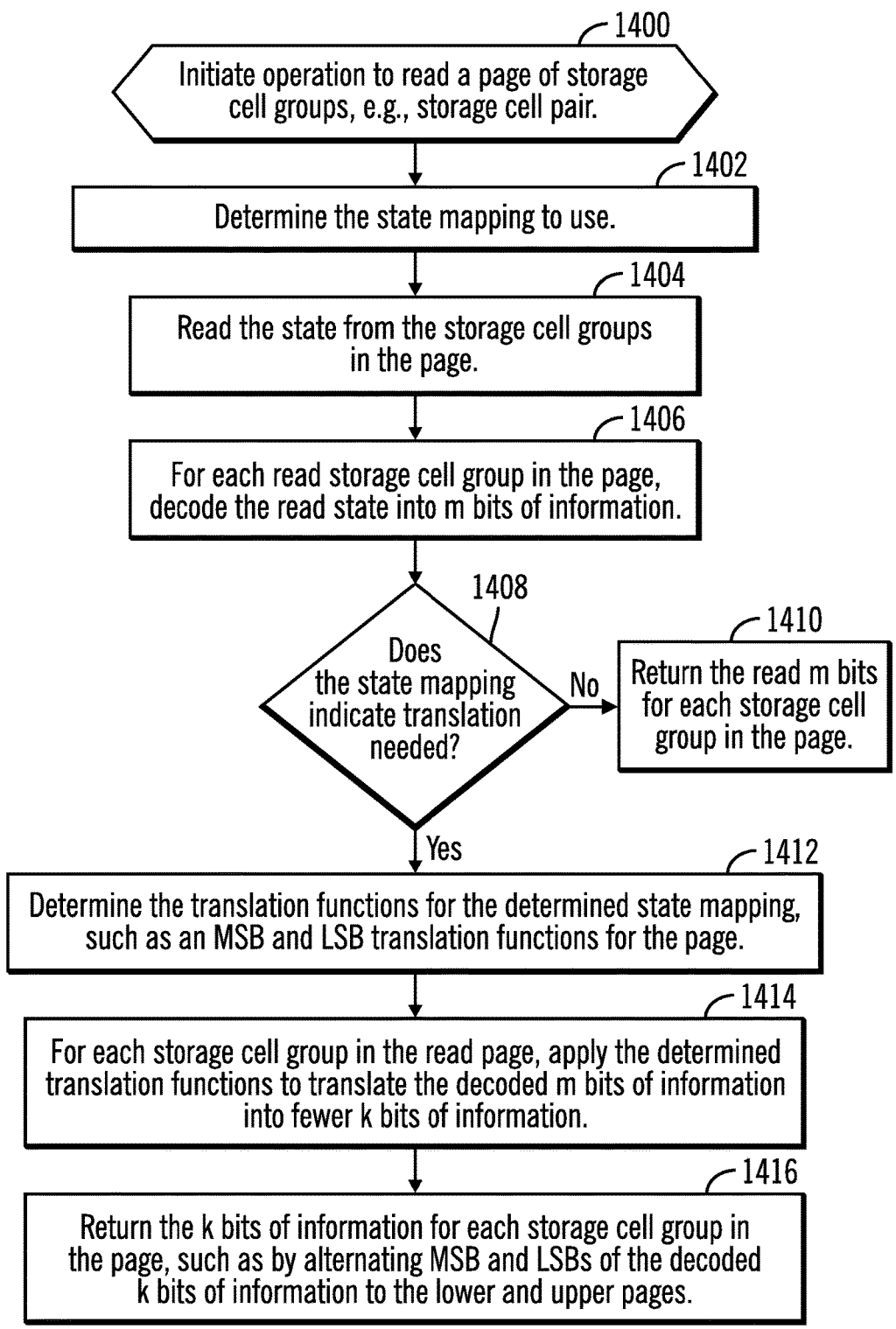
FIG. 14 illustrates an embodiment of operations to read a storage cell pair.

FIG. 14 illustrates an embodiment of operations performed by the I/O logic 202 and/or the transformation layer $114_i$ to read a page of blocks of data in storage cell groups, such as when each block is stored in a storage cell pair. Upon initiating (at block 1400) the read operation for a device page $300_i$ of storage cell groups, the I/O logic 202 determines (at block 1402) the state mapping $400_i$ to use, which may be indicated in the device page information $300_i$ for the page to read or may be determined from an operational mode of the memory storage device 100. The state from the storage cell group in the device page $300_i$ is read (at block 1404), such as a threshold voltage level for each of the p storage cells in the storage cell group. The I/O logic 202 decodes (at block 1406) the read state represented by read threshold voltage levels from the p cells in the storage cell group. If (at block 1408) the state mapping $400_i$ indicates that there is no translation or no translation functions 412, then the transformation layer $114_i$ returns (at block 1410) the read block of m bits of information. If (at block 1408) the translation is required, then the transformation layer $114_i$ determines (at block 1412) the bit translation functions 412 for the read m bits of information for a device page $300_i$, such as the translation functions (1), (2), (3), (4), and (5) described above with respect to a storage cell pair where k=3 bits and where k=2 bits. The transformation layer $114_i$ applies (at block 1414), for each storage cell group in the read page, the determined translation functions to translate the decoded m bits of information to a block of fewer k bits of information and returns (at block 1416) the block of k bits to the host requesting the page of data. In returning the translated k (or 3 bits), the transformation layer $114_i$ may alternately write the MSB and LSBs read for each storage cell pair when writing the bits to upper and lower pages.

With the described operations of FIG. 14, the transformation layer $114_i$ or I/O logic 202 uses the normal page mapping by writing to the same storage cells without requiring special translation to manage the page and track size, because the described embodiments read the data for all the storage cells on the page boundaries, but translates the read m bits of information into a block of fewer k bits provided by a host operating system. Further, the described embodiments improve storage cell endurance by avoiding use the highest threshold voltage levels to write received data if the memory storage device 100 is programmed to use less than all available threshold voltages.

Figure 15:
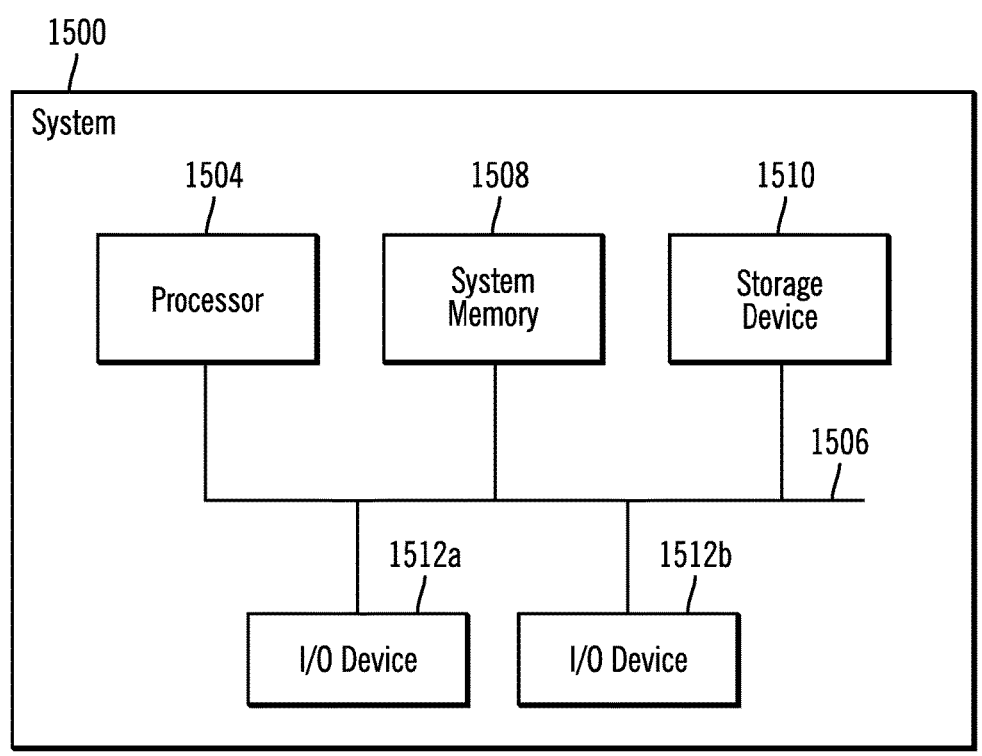
FIG. 15 illustrates a system in which the memory device of FIG. 1 may be deployed.

FIG. 15 illustrates an embodiment of a system 1500 in which the memory device 100 may be deployed as the system memory device 1508 and/or a storage device 1510. The system includes a processor 1504 that communicates over a bus 1506 with a system memory device 1508 in which programs, operands and parameters being executed are cached, and a storage device 1510, which may comprise a solid state drive (SSD) that stores programs and user data that may be loaded into the system memory 1508 for execution. The processor 1504 may also communicate with Input/Output (I/O) devices 1512*a*, 1512*b*, which may comprise input devices (e.g., keyboard, touchscreen, mouse, etc.), display devices, graphics cards, ports, network interfaces, etc. The memory 1508 and storage device 1510 may be coupled to an interface on the system 1500 motherboard, mounted on the system 1500 mother board, or deployed in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

The reference characters used herein, such as i, j, m, n, and p are used to denote a variable number of instances of an element, which may represent the same or different values, and may represent the same or different value when used with different or the same elements in different described instances.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

EXAMPLES

The following examples pertain to further embodiments.

Example 1 is an apparatus for organizing storage cells as storage cell groups, comprising: a non-volatile memory having storage cells, wherein each storage cell is programmed with information using a plurality of threshold voltage levels, and wherein each storage cell is programmed from bits from a plurality of pages; and a memory controller configured to program the storage cells and to: organize the storage cells in the non-volatile memory into storage cell groups, wherein each storage cell group stores a number of bits of information, wherein each of the storage cells in each of the storage cell groups is programmed with the plurality of threshold voltage levels; select bits from the pages to write for one storage cell group; and determine at least one threshold voltage level to use for each of the storage cells in the storage cell group to program the selected bits in the storage cell group.

In Example 2, the subject matter of claims 1 and 3-11 can optionally include that the selected bits from the pages to write comprises the number of bits of information stored in each storage cell group, wherein all of the plurality of threshold voltage levels are used to program all possible bits determined from the pages.

In Example 3, the subject matter of claims 1, 2 and 4-11 can optionally include that the plurality of threshold voltage levels comprises a first number of threshold voltage levels, wherein the number of bits of information stored in each of the storage cell groups comprises a first number of bits of information, wherein the number of bits selected from the pages comprises a second number of bits of information, wherein the second number of bits of information is less than the first number of bits of information, wherein the memory control is further configured to: operate in a translation mode using only a second number of threshold voltage levels to program the second number of bits of information in each of the storage cells of the storage cell groups, wherein the second number of threshold voltage levels is less than the first number of threshold voltage levels.

In Example 4, the subject matter of claims 1-3 and 5-11 can optionally include that the second number of threshold voltage levels comprises a lowest of the first number of threshold voltage levels.

In Example 5, the subject matter of claims 1-4 and 6-11 can optionally include that each multi-level cell comprises n bits and can be programmed into $2^n$ separate states with $2^n$ different threshold voltage levels, wherein the first number of threshold voltage levels comprises $2^n$, wherein the second number of threshold voltage levels comprises j threshold voltage levels, where $j<2^n$, wherein each of the storage cell groups has p storage cells, wherein each storage cell group represents $2^{np}$ states of information, wherein the first number of bits of information comprises m bits of information, where $m=\text{Log}_2(2^{np})$ bits of information, and wherein the second number of bits of information comprises k bits of information, where $k<m$ and k is a largest integer less than or equal to $\text{Log}_2(j_p)$.

In Example 6, the subject matter of claims 1-5 and 7-11 can optionally include that the memory controller is further to: read a state of the storage cells in the storage cell group; decode the read state into decoded bits having the first number of bits of information; translate the decoded bits into translated bits having the second number of bits of information; and return the translated bits of information.

In Example 7, the subject matter of claims 1-6 and 8-11 can optionally include that the memory controller is further to: provide translation functions based on a truth table associating states of the second number of bits of information with a subset of states of the first number of bits of information, wherein the subset of states of the first number of bits of information are programmed using the second number of threshold voltage levels; and use the translation functions to translate the second number of bits of information to the first number of bits of information to program in one of the storage cell groups and to translate a read first number of bits of information from one of the storage cell groups to the second number of bits of information.

In Example 8, the subject matter of claims 1-7 and 9-11 can optionally include that there are at least two significant bit sections of the second number of bits of information, wherein selecting bits from the pages for a current storage cell group comprises selecting each of the at least two significant bit sections from different pages from which the at least two significant bit sections were selected for a previous storage cell group.

In Example 9, the subject matter of claims 1-8 and 10-11 can optionally include that the memory controller is further to: read the first number of bits of information from one of the storage cell groups; translate the read first number of bits of information to a translated second number of bits of information; and for each storage cell group, alternate writing the at least two significant bit sections of the translated second number of bits of information to different pages to which the at least two significant bit sections were written for a previous storage cell group.

In Example 10, the subject matter of claims 1-9 and 11 can optionally include that each of the storage cell groups comprises a storage cell pair of two storage cells, wherein the each of the storage cells stores two bits of information, wherein the first number of bits of information comprises four bits, wherein the second number of bits comprises three bits, wherein the selected bits for each storage cell group are selected from a first page and a second page.

In Example 11, the subject matter of claims 1-10 can optionally include that the selecting the bits from the first page and the second page for a current storage cell group comprises selecting one most significant bit and two least significant bits from different of the first and second pages from which the most significant bit and the two least significant bits were selected for a previous storage cell group programmed before the current storage cell group is programmed.

Example 12 is a system for organizing storage cells as storage cell groups, comprising: a processor; a bus, wherein the processor is coupled to the bus; and a non-volatile memory having: data in storage cells accessed by the processor over the bus, wherein each storage cell is programmed with information using a plurality of threshold voltage levels, and wherein each storage cell is programmed from bits from a plurality of pages; and a memory controller configured to program the storage cells and to: organize the storage cells in the non-volatile memory into storage cell groups, wherein each storage cell group stores a number of bits of information, wherein each of the storage cells in each of the storage cell groups is programmed with the plurality of threshold voltage levels; select bits from the pages to write for one storage cell group; and determine at least one threshold voltage level to use for each of the storage cells in the storage cell group to program the selected bits in the storage cell group.

In Example 13, the subject matter of claims 12 and 14-18 can optionally include that the plurality of threshold voltage levels comprises a first number of threshold voltage levels, wherein the number of bits of information stored in each of the storage cell groups comprises a first number of bits of information, wherein the number of bits selected from the pages comprises a second number of bits of information, wherein the second number of bits of information is less than the first number of bits of information, wherein the memory control is further configured to: operate in a translation mode using only a second number of threshold voltage levels to program the second number of bits of information in each of the storage cells of the storage cell groups, wherein the second number of threshold voltage levels is less than the first number of threshold voltage levels.

In Example 14, the subject matter of claims 12, 13, and 15-18 can optionally include that the second number of threshold voltage levels comprises a lowest of the first number of threshold voltage levels.

In Example 15, the subject matter of claims 12-14 and 16-18 can optionally include that the memory controller is further to: read a state of the storage cells in the storage cell group; decode the read state into decoded bits having the first number of bits of information; translate the decoded bits into translated bits having the second number of bits of information; and return the translated bits of information.

In Example 16, the subject matter of claims 12-15 and 17-18 can optionally include that the memory controller is further to: provide translation functions based on a truth table associating states of the second number of bits of information with a subset of states of the first number of bits of information, wherein the subset of states of the first number of bits of information are programmed using the second number of threshold voltage levels; and use the translation functions to translate the second number of bits of information to the first number of bits of information to program in one of the storage cell groups and to translate a read first number of bits of information from one of the storage cell groups to the second number of bits of information.

In Example 17, the subject matter of claims 12-16 and 18 can optionally include that there are at least two significant bit sections of the second number of bits of information, wherein selecting bits from the pages for a current storage cell group comprises selecting each of the at least two significant bit sections from different pages from which the at least two significant bit sections were selected for a previous storage cell group.

In Example 18, the subject matter of claims 12-17 can optionally include that the memory controller is further to: read the first number of bits of information from one of the storage cell groups; translate the read first number of bits of information to a translated second number of bits of information; and for each storage cell group, alternate writing the at least two significant bit sections of the translated second number of bits of information to different pages to which the at least two significant bit sections were written for a previous storage cell group.

Example 19 is a method for organizing storage cells as storage cell groups in a non-volatile memory, comprising: programming storage cells in the non-volatile memory with information using a plurality of threshold voltage levels, and wherein each storage cell is programmed from bits from a plurality of pages; organizing the storage cells in the non-volatile memory into storage cell groups, wherein each storage cell group stores a number of bits of information, wherein each of the storage cells in each of the storage cell groups is programmed with the plurality of threshold voltage levels; selecting bits from the pages to write for one storage cell group; and determining at least one threshold voltage level to use for each of the storage cells in the storage cell group to program the selected bits in the storage cell group.

In Example 20, the subject matter of claims 21-25 can optionally include that the plurality of threshold voltage levels comprises a first number of threshold voltage levels, wherein the number of bits of information stored in each of the storage cell groups comprises a first number of bits of information, wherein the number of bits selected from the pages comprises a second number of bits of information, wherein the second number of bits of information is less than the first number of bits of information, further comprising: operating in a translation mode using only a second number of threshold voltage levels to program the second number of bits of information in each of the storage cells of the storage cell groups, wherein the second number of threshold voltage levels is less than the first number of threshold voltage levels.

In Example 21, the subject matter of claims 20 and 22-25-can optionally include that the second number of threshold voltage levels comprises a lowest of the first number of threshold voltage levels.

In Example 22, the subject matter of claims 20, 21, and 23-25 can optionally include reading a state of the storage cells in the storage cell group; decoding the read state into decoded bits having the first number of bits of information; translating the decoded bits into translated bits having the second number of bits of information; and returning the translated bits of information.

In Example 23, the subject matter of claims 20-22 and 24-25 can optionally include providing translation functions based on a truth table associating states of the second number of bits of information with a subset of states of the first number of bits of information, wherein the subset of states of the first number of bits of information are programmed using the second number of threshold voltage levels; and using the translation functions to translate the second number of bits of information to the first number of bits of information to program in one of the storage cell groups and to translate a read first number of bits of information from one of the storage cell groups to the second number of bits of information.

In Example 24, the subject matter of claims 20-23 and 25 can optionally include that there are at least two significant bit sections of the second number of bits of information, wherein selecting bits from the pages for a current storage cell group comprises selecting each of the at least two significant bit sections from different pages from which the at least two significant bit sections were selected for a previous storage cell group.

In Example 25, the subject matter of claims 20-24 can optionally include reading the first number of bits of information from one of the storage cell groups; translating the read first number of bits of information to a translated second number of bits of information; and for each storage cell group, alternating writing the at least two significant bit sections of the translated second number of bits of information to different pages to which the at least two significant bit sections were written for a previous storage cell group.

In Example 26, the subject matter of claim 20 an optionally at least any one of:

(1) wherein the selected bits from the pages to write comprises the number of bits of information stored in each storage cell group, wherein all of the plurality of threshold voltage levels are used to program all possible bits determined from the pages; and/or (2) wherein the plurality of threshold voltage levels comprises a first number of threshold voltage levels, wherein the number of bits of information stored in each of the storage cell groups comprises a first number of bits of information, wherein the number of bits selected from the pages comprises a second number of bits of information, wherein the second number of bits of information is less than the first number of bits of information, wherein the memory control is further configured to: operate in a translation mode using only a second number of threshold voltage levels to program the second number of bits of information in each of the storage cells of the storage cell groups, wherein the second number of threshold voltage levels is less than the first number of threshold voltage levels; and/or (3) wherein the second number of threshold voltage levels comprises a lowest of the first number of threshold voltage levels; and/or (4) wherein each multi-level cell comprises n bits and can be programmed into $2^n$ separate states with $2^n$ different threshold voltage levels, wherein the first number of threshold voltage levels comprises $2^n$, wherein the second number of threshold voltage levels comprises j threshold voltage levels, where $j<2^n$, wherein each of the storage cell groups has p storage cells, wherein each storage cell group represents $2^{np}$ states of information, wherein the first number of bits of information comprises m bits of information, where $m=\text{Log}_2(2^{np})$ bits of information, and wherein the second number of bits of information comprises k bits of information, where $k<m$ and k is a largest integer less than or equal to $\text{Log}_2(j^p)$; and/or (5) reading a state of the storage cells in the storage cell group; decoding the read state into decoded bits having the first number of bits of information; translating the decoded bits into translated bits having the second number of bits of information; and returning the translated bits of information; and/or (6) providing translation functions based on a truth table associating states of the second number of bits of information with a subset of states of the first number of bits of information, wherein the subset of states of the first number of bits of information are programmed using the second number of threshold voltage levels; and using the translation functions to translate the second number of bits of information to the first number of bits of information to program in one of the storage cell groups and to translate a read first number of bits of information from one of the storage cell groups to the second number of bits of information; and/or (7) wherein there are at least two significant bit sections of the second number of bits of information, wherein selecting bits from the pages for a current storage cell group comprises selecting each of the at least two significant bit sections from different pages from which the at least two significant bit sections were selected for a previous storage cell group; and/or (8) reading the first number of bits of information from one of the storage cell groups; translating the read first number of bits of information to a translated second number of bits of information; and for each storage cell group, alternating writing the at least two significant bit sections of the translated second number of bits of information to different pages to which the at least two significant bit sections were written for a previous storage cell group; and/or (9) wherein each of the storage cell groups comprises a storage cell pair of two storage cells, wherein the each of the storage cells stores two bits of information, wherein the first number of bits of information comprises four bits, wherein the second number of bits comprises three bits, wherein the selected bits for each storage cell group are selected from a first page and a second page; and/or

(10) wherein the selecting the bits from the first page and the second page for a current storage cell group comprises selecting one most significant bit and two least significant bits from different of the first and second pages from which the most significant bit and the two least significant bits were selected for a previous storage cell group programmed before the current storage cell group is programmed.

Example 27 is an apparatus for organizing storage cells as storage cell groups in a non-volatile memory, comprising: means for programming storage cells in the non-volatile memory with information using a plurality of threshold voltage levels, and wherein each storage cell is programmed from bits from a plurality of pages; means for organizing the storage cells in the non-volatile memory into storage cell groups, wherein each storage cell group stores a number of bits of information, wherein each of the storage cells in each of the storage cell groups is programmed with the plurality of threshold voltage levels; means for selecting bits from the pages to write for one storage cell group; and means for determining at least one threshold voltage level to use for each of the storage cells in the storage cell group to program the selected bits in the storage cell group.

In Example 28, the subject matter of claim 27 can optionally include that the plurality of threshold voltage levels comprises a first number of threshold voltage levels, wherein the number of bits of information stored in each of the storage cell groups comprises a first number of bits of information, wherein the number of bits selected from the pages comprises a second number of bits of information, wherein the second number of bits of information is less than the first number of bits of information, further comprising: means for operating in a translation mode using only a second number of threshold voltage levels to program the second number of bits of information in each of the storage cells of the storage cell groups, wherein the second number of threshold voltage levels is less than the first number of threshold voltage levels.

Example 29 is an apparatus comprising means to perform a method as claimed in any preceding claim.

Example 30 is a machine-readable storage including machine-readable instructions, when executed, to implement a method or realize an apparatus as claimed in any preceding claim.

What is claimed:

1. An apparatus, comprising:
 a non-volatile memory having storage cells, wherein each storage cell is programmed with information using a plurality of threshold voltage levels, and wherein each storage cell is programmed from bits from a plurality of pages; and
 a memory controller configured to program the storage cells and to:
  organize the storage cells in the non-volatile memory into storage cell groups, wherein each storage cell group stores a number of bits of information, wherein each of the storage cells in each of the storage cell groups is programmed with the plurality of threshold voltage levels;
  select bits from the pages to write for one storage cell group; and
  determine at least one threshold voltage level to use for each of the storage cells in the storage cell group to program the selected bits in the storage cell group.

2. The apparatus of claim 1, wherein the selected bits from the pages to write comprises the number of bits of information stored in each storage cell group, wherein all of the plurality of threshold voltage levels are used to program all possible bits determined from the pages.

3. The apparatus of claim 1, wherein the plurality of threshold voltage levels comprises a first number of threshold voltage levels, wherein the number of bits of information stored in each of the storage cell groups comprises a first number of bits of information, wherein the number of bits selected from the pages comprises a second number of bits of information, wherein the second number of bits of information is less than the first number of bits of information, wherein the memory controller is further configured to:
 operate in a translation mode using only a second number of threshold voltage levels to program the second number of bits of information in each of the storage cells of the storage cell groups, wherein the second number of threshold voltage levels is less than the first number of threshold voltage levels.

4. The apparatus of claim 3, wherein the second number of threshold voltage levels comprises a lowest of the first number of threshold voltage levels.

5. The apparatus of claim 3, wherein each multi-level cell comprises n bits and can be programmed into 2n separate states with 2n different threshold voltage levels, wherein the first number of threshold voltage levels comprises 2n, wherein the second number of threshold voltage levels comprises j threshold voltage levels, where j<2n, wherein each of the storage cell groups has p storage cells, wherein each storage cell group represents 2np states of information, wherein the first number of bits of information comprises m bits of information, where m=Log2(2np) bits of information, and wherein the second number of bits of information comprises k bits of information, where k<m and k is a largest integer less than or equal to Log2(jp).

6. The apparatus of claim 3, wherein the memory controller is further to:
 read a state of the storage cells in the storage cell group;
 decode the read state into decoded bits having the first number of bits of information;
 translate the decoded bits into translated bits having the second number of bits of information; and
 return the translated bits of information.

7. The apparatus of claim 3, wherein the memory controller is further to:
 provide translation functions based on a truth table associating states of the second number of bits of information with a subset of states of the first number of bits of information, wherein the subset of states of the first number of bits of information are programmed using the second number of threshold voltage levels; and
 use the translation functions to translate the second number of bits of information to the first number of bits of information to program in one of the storage cell groups and to translate a read first number of bits of information from one of the storage cell groups to the second number of bits of information.

8. The apparatus of claim 3, wherein there are at least two significant bit sections of the second number of bits of information, wherein selecting bits from the pages for a current storage cell group comprises selecting each of the at least two significant bit sections from different pages from which the at least two significant bit sections were selected for a previous storage cell group.

9. The apparatus of claim 8, wherein the memory controller is further to:
 read the first number of bits of information from one of the storage cell groups;
 translate the read first number of bits of information to a translated second number of bits of information; and
 for each storage cell group, alternate writing the at least two significant bit sections of the translated second number of bits of information to different pages to which the at least two significant bit sections were written for a previous storage cell group.

10. The apparatus of claim 3, wherein each of the storage cell groups comprises a storage cell pair of two storage cells, wherein the each of the storage cells stores two bits of information, wherein the first number of bits of information comprises four bits, wherein the second number of bits comprises three bits, wherein the selected bits for each storage cell group are selected from a first page and a second page.

11. The apparatus of claim 10, wherein the selecting the bits from the first page and the second page for a current storage cell group comprises selecting one most significant bit and two least significant bits from different of the first and second pages from which the most significant bit and the two least significant bits were selected for a previous storage cell group programmed before the current storage cell group is programmed.

12. A system, comprising:
a processor;
a bus, wherein the processor is coupled to the bus; and
a non-volatile memory having:
data in storage cells accessed by the processor over the bus, wherein each storage cell is programmed with information using a plurality of threshold voltage levels, and wherein each storage cell is programmed from bits from a plurality of pages; and
a memory controller configured to program the storage cells and to:
organize the storage cells in the non-volatile memory into storage cell groups, wherein each storage cell group stores a number of bits of information, wherein each of the storage cells in each of the storage cell groups is programmed with the plurality of threshold voltage levels;
select bits from the pages to write for one storage cell group; and
determine at least one threshold voltage level to use for each of the storage cells in the storage cell group to program the selected bits in the storage cell group.

13. The system of claim 12, wherein the plurality of threshold voltage levels comprises a first number of threshold voltage levels, wherein the number of bits of information stored in each of the storage cell groups comprises a first number of bits of information, wherein the number of bits selected from the pages comprises a second number of bits of information, wherein the second number of bits of information is less than the first number of bits of information, wherein the memory controller is further configured to:
operate in a translation mode using only a second number of threshold voltage levels to program the second number of bits of information in each of the storage cells of the storage cell groups, wherein the second number of threshold voltage levels is less than the first number of threshold voltage levels.

14. The system of claim 13, wherein the second number of threshold voltage levels comprises a lowest of the first number of threshold voltage levels.

15. The system of claim 13, wherein the memory controller is further to:
read a state of the storage cells in the storage cell group;
decode the read state into decoded bits having the first number of bits of information;
translate the decoded bits into translated bits having the second number of bits of information; and
return the translated bits of information.

16. The system of claim 13, wherein the memory controller is further to:
provide translation functions based on a truth table associating states of the second number of bits of information with a subset of states of the first number of bits of information, wherein the subset of states of the first number of bits of information are programmed using the second number of threshold voltage levels; and use the translation functions to translate the second number of bits of information to the first number of bits of information to program in one of the storage cell groups and to translate a read first number of bits of information from one of the storage cell groups to the second number of bits of information.

17. The system of claim 13, wherein there are at least two significant bit sections of the second number of bits of information, wherein selecting bits from the pages for a current storage cell group comprises selecting each of the at least two significant bit sections from different pages from which the at least two significant bit sections were selected for a previous storage cell group.

18. The system of claim 17, wherein the memory controller is further to:
read the first number of bits of information from one of the storage cell groups;
translate the read first number of bits of information to a translated second number of bits of information; and
for each storage cell group, alternate writing the at least two significant bit sections of the translated second number of bits of information to different pages to which the at least two significant bit sections were written for a previous storage cell group.

19. A method for managing a non-volatile memory, comprising:
programming storage cells in the non-volatile memory with information using a plurality of threshold voltage levels, and wherein each storage cell is programmed from bits from a plurality of pages;
organizing the storage cells in the non-volatile memory into storage cell groups, wherein each storage cell group stores a number of bits of information, wherein each of the storage cells in each of the storage cell groups is programmed with the plurality of threshold voltage levels;
selecting bits from the pages to write for one storage cell group; and
determining at least one threshold voltage level to use for each of the storage cells in the storage cell group to program the selected bits in the storage cell group.

20. The method of claim 19, wherein the plurality of threshold voltage levels comprises a first number of threshold voltage levels, wherein the number of bits of information stored in each of the storage cell groups comprises a first number of bits of information, wherein the number of bits selected from the pages comprises a second number of bits of information, wherein the second number of bits of information is less than the first number of bits of information, further comprising:
operating in a translation mode using only a second number of threshold voltage levels to program the second number of bits of information in each of the storage cells of the storage cell groups, wherein the second number of threshold voltage levels is less than the first number of threshold voltage levels.

21. The method of claim 20, wherein the second number of threshold voltage levels comprises a lowest of the first number of threshold voltage levels.

22. The method of claim 20, further comprising:
reading a state of the storage cells in the storage cell group;
decoding the read state into decoded bits having the first number of bits of information;
translating the decoded bits into translated bits having the second number of bits of information; and
returning the translated bits of information.

23. The method of claim 20, further comprising:
provide translation functions based on a truth table associating states of the second number of bits of information with a subset of states of the first number of bits of information, wherein the subset of states of the first number of bits of information are programmed using the second number of threshold voltage levels; and using the translation functions to translate the second number of bits of information to the first number of bits of information to program in one of the storage cell groups and to translate a read first number of bits of information from one of the storage cell groups to the second number of bits of information.

24. The method of claim 20, wherein there are at least two significant bit sections of the second number of bits of information, wherein selecting bits from the pages for a current storage cell group comprises selecting each of the at least two significant bit sections from different pages from which the at least two significant bit sections were selected for a previous storage cell group.

25. The method of claim 24, further comprising:
reading the first number of bits of information from one of the storage cell groups;

translating the read first number of bits of information to a translated second number of bits of information; and for each storage cell group, alternating writing the at least two significant bit sections of the translated second number of bits of information to different pages to which the at least two significant bit sections were written for a previous storage cell group.

\* \* \* \* \*